(12) United States Patent
Ohsawa et al.

(10) Patent No.: US 7,924,529 B2
(45) Date of Patent: Apr. 12, 2011

(54) SUSPENSION BOARD WITH CIRCUIT

(75) Inventors: Tetsuya Ohsawa, Ibaraki (JP); Naohiro Terada, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 679 days.

(21) Appl. No.: 12/007,560

(22) Filed: Jan. 11, 2008

(65) Prior Publication Data

US 2008/0170333 A1 Jul. 17, 2008

Related U.S. Application Data

(60) Provisional application No. 60/904,808, filed on Mar. 5, 2007.

(30) Foreign Application Priority Data

Jan. 11, 2007 (JP) ................. 2007-003621

(51) Int. Cl.
G11B 5/60 (2006.01)
G11B 5/48 (2006.01)

(52) U.S. Cl. .................. 360/234.5; 360/244.5

(58) Field of Classification Search ............. 360/234.5, 360/294.4, 245.3, 244.5, 245.9, 125.74, 125.71, 360/245.8, 254.7, 244.1, 264.2, 294.3, 234.6, 360/234.7

See application file for complete search history.

(56) References Cited

U.S. PATENT DOCUMENTS

| | | | |
|---|---|---|---|
| 6,268,980 B1 | 7/2001 | Shiraishi et al. | |
| 6,396,665 B1 | 5/2002 | Asano | |
| 7,486,480 B2 * | 2/2009 | Satoh et al. | 360/234.5 |
| 2003/0070834 A1 | 4/2003 | Tsuchiya et al. | |
| 2006/0087769 A1 | 4/2006 | Ohsawa et al. | |
| 2006/0193084 A1 * | 8/2006 | Satoh et al. | 360/234.5 |
| 2006/0292738 A1 | 12/2006 | Backlund et al. | |
| 2008/0253025 A1 * | 10/2008 | Fu et al. | 360/234.5 |
| 2010/0118445 A1 * | 5/2010 | Ohsawa et al. | 360/246.2 |
| 2010/0188779 A1 * | 7/2010 | Ohsawa et al. | 360/246.1 |

FOREIGN PATENT DOCUMENTS

| | | |
|---|---|---|
| EP | 1 651 021 | 4/2006 |
| JP | 10-012983 | 1/1998 |
| JP | 10-079105 | 3/1998 |
| JP | 2002-050018 | 2/2002 |
| JP | 2002-50018 | 2/2002 |
| JP | 2006-120288 | 5/2006 |

OTHER PUBLICATIONS

European Search Report issued Oct. 24, 2008 in corresponding European Patent Application No. 08 250 082.

* cited by examiner

*Primary Examiner* — Allen T Cao
(74) *Attorney, Agent, or Firm* — Wenderoth, Lind & Ponack, L.L.P.

(57) ABSTRACT

A stepped-part 4b with a lower tip side is formed on the top face of a pattern end 4, and a lower face 4c thereof is used as a plane on which a solder ball 7 is provided. One or more protrusions 4d made of a swollen conductive layer are formed on the lower face to limit displacement of the solder ball in the tip direction and the both side directions. The solder ball is held by the protrusions to suppress deviation of the solder ball.

14 Claims, 10 Drawing Sheets (a)

(b)

(a)

(b)

(a)

(b)

(c)

(a)

(b)

(a)

(b)

(c)

(d)

(a)

(b)

(c)

(a)

(b)

(a)

(b)

SUSPENSION BOARD WITH CIRCUIT

The present application claims priority to Provisional Application No. 60/904,808, filed Mar. 5, 2007.

FIELD OF THE INVENTION

The present invention relates to a suspension board with a circuit, which is used for a magnetic head of a hard disc drive.

BACKGROUND OF THE INVENTION

A hard disc drive, one of the magnetic storage devices in a computer, shows remarkable technical advances in achieving high-speed, high density, mass storage and the like. Its magnetic head for reading/writing is required to read/write on the surface of a magnetic disc rotating at a high speed, without a contact therewith but maintaining a small gap of a submicron order.

There can be mentioned a suspension board with a circuit, as a component for elastically pushing a magnetic head toward a magnetic disc surface rotating at a high speed, while resisting the airflow generated in the small gap, thereby to maintain a small gap between a surface of the magnetic disc and the magnetic head.

In a suspension board with a circuit, an elastic metal such as a stainless steel foil and the like is used as a material of the board, wherein one embodiment of the shape of the whole parts is, as shown in FIG. 1 of JP-A-10-12983 (Patent Reference 1), a kind of a band-like flat spring having a magnetic head mounting area and a circuit pattern.

A base end side of a suspension board with a circuit is fixed to an arm member extending from a device body of a hard disk driver and a magnetic head is mounted on a tip side (free end side), and the suspension board has a configuration wherein the board elastically supports the magnetic head on the tip side like a cantilever.

FIG. 9 is a schematic view of an enlarged tip part alone of a conventional suspension board with a circuit, and shows the configuration of the circuit and connections. A protective film covering the circuit, and so on have been omitted.

As shown in FIG. 9, the tip part of a metal board 100 has an area 130 to mount a magnetic head thereon, and a through-hole 140 is formed to surround therearound, whereby the area 130 is supported like a cantilever on the tip side alone at the center of the tip part of the metal board 100.

Furthermore, a conductive layer (circuit pattern shown with extra-thick line) 120 to transmit power, signal and the like is formed from the base side (leftward side of Figure, not shown) of the board to the terminal of the magnetic head on the metal board, via an insulating layer 110. Said circuit pattern 120 has a pattern end 121 to be a connection terminal (or terminal pad, electrode pad) is formed to connect a terminal of the magnetic head.

While various bonding methods have been proposed to connect the terminal of a magnetic head and an end of a pattern, techniques to connect them using a solder has been adopted in recent years so that even if the attached magnetic head is defective, only the magnetic head can be replaced easily without discarding the whole assembly.

Particularly, as a method for dealing with small terminals of magnetic heads and narrow-pitched arrangement thereof, connecting methods using a solder ball can be mentioned. As shown in FIG. 10(a), this connecting method comprises first arranging a terminal H11 of a magnetic head H10 and a pattern end (terminal pad for connection) 121 of a circuit closely to each other forming a right angle, and supplying a solder ball 150 in contact with both terminal surfaces. Then, a laser beam is irradiated on the ball to melt it as shown in FIG. 10(b) to establish a connection.

JP-A-10-79105 (Patent Reference 2) and JP-A-2002-50018 (Patent Reference 3) describe in detail connection methods using a solder ball, a supply device (solder ball supply element) of a solder ball and the like.

In contrast to the above-mentioned connecting method using a solder ball, the present applicant has focused attention on a fact that positional dispersion of the solder ball arranged on a pattern end is not preferable for laser beam irradiation and afforded a structure capable of reducing the dispersion to the upper surface of the pattern end (JP-A-2006-120288 (Patent Reference 4)). The invention of the Patent Reference 4, as shown in FIG. 4 of the reference, a stepped-part is provided on a surface of the pattern end for limiting the position of the solder ball and limiting a backward displacement of the solder ball, and as shown in FIG. 7 of the reference, two ridge-shaped protrusions are further formed and a solder ball is arranged between them. By the two ridge-shaped protrusions, displacement of the solder ball in a lateral direction (transversely) is suppressed, which improves a hit probability of the laser beam.

However, the present inventors have studied the above-mentioned structure of the Patent Reference 4 in detail, and found that as a circuit pattern or pattern end becomes more microfine, the space between two ridge-shaped protrusions is narrowed, and in some cases, the supplied solder ball rolls away and is scattered from the position where the solder ball should be held.

An object of the present invention is to provide a structure to a suspension board with a circuit, wherein a solder ball supplied during laser irradiation can stay stably at a given position and will not be lost easily.

SUMMARY OF THE INVENTION

The present inventors have conducted intensive studies in an attempt to solve the aforementioned problems and found that a phenomenon of rolling and scattering of a solder ball can be suppressed not only by a simple limitation, with two ridge-shaped protrusions, of a solder ball to be supplied but also by forming protrusions to limit displacement of a solder ball in a tip direction, which is a direction from a stepped-part side toward the tip side, as well as displacement of a solder ball in a both side direction, which is the orthogonal direction relative to the tip direction, which resulted in the completion of the present invention.

Accordingly, the present invention is characterized by the following.

(1) A suspension board with a circuit, which comprises a metal board comprising an area for mounting a magnetic head, and other area comprising a conductive layer provided on the metal board as a circuit pattern via an insulating layer, said circuit pattern having a pattern end to be a terminal for connection with a terminal of the magnetic head, the pattern end having, on its top face, a stepped-part with a lower tip side, wherein a lower face of the stepped-part is used as a plane to set a solder ball, and the lower face having one or more protrusions made of a swollen conductive layer to limit displacement of the solder ball at least in a tip direction, which is a direction from the stepped-part side toward the tip side, as well as displacement of the solder ball in both side directions, which are orthogonal directions relative to the tip direction.

(2) The suspension board of the above-mentioned (1), wherein the displacement of the solder ball in a stepped-part direction, which is a direction from the tip side toward the stepped-part side, is limited by the stepped-part.

(3) The suspension board of the above-mentioned (1), wherein the protrusions comprise a protrusion on a stepped-part side, which protrusion is located closer to the stepped-part than the solder ball to be set, the protrusion on the stepped-part side is so formed as to limit displacement of the solder ball in a stepped-part direction, which is a direction from the tip side toward the stepped-part side.

(4) The suspension board of the above-mentioned (3), wherein s said protrusion on the stepped-part side is so formed as to be able to contact the solder ball at two or more points so that it can limit displacement of the solder ball in the stepped-part direction, and simultaneously, displacement in the both side directions.

(5) The suspension board of the above-mentioned (3), wherein said protrusion is so formed as to be able to contact the periphery of the solder ball at three or four points so that it can limit displacement of the solder ball in the tip direction, the both side directions and the stepped-part direction.

(6) The suspension board of the above-mentioned (1), wherein said protrusions comprise side protrusions located in both transverse directions relative to the center of the solder ball to be set, and the side protrusions can limit displacement of the solder ball in the both side directions.

(7) The suspension board of the above-mentioned (1), wherein said protrusions comprise a tip side protrusion located closer to the tip than the solder ball to be set, and the tip side protrusion is so formed as to limit displacement of the solder ball in the tip direction.

(8) The suspension board of the above-mentioned (7), wherein the tip side protrusion is so formed as to be able to contact the solder ball at two or more points so that it can limit displacement of the solder ball in the tip direction, and simultaneously, displacement in the both side directions.

(9) The suspension board of the above-mentioned (1), wherein the protrusions on the top face of the pattern end are island-like protrusions independent of each other or ridge-shaped protrusions, or include both of these protrusions.

(10) The suspension board of the above-mentioned (1), wherein the protrusion on the top face of the pattern end comprises two ridge-shaped protrusions extending from the stepped-part side to the tip side, and the two protrusions each have a notch part at the center thereof, which establishes contact with the solder ball at 4 points.

(11) The suspension board of the above-mentioned (1), wherein the insulating layer directly beneath the pattern end has an insulating layer stepped-part forming a lower tip side on the top face thereof, so that said stepped-part will be formed on the top face of the pattern end, the lower face of the insulating layer stepped-part has an insulating layer protrusion to be a core of said protrusion on the lower face of the pattern end, and the insulating layer stepped-part and the insulating layer protrusion are covered by the pattern end, whereby said stepped-part and said protrusion are formed on the top face of the pattern end.

(12) The suspension board of the above-mentioned (11), wherein the insulating layer is made from a photosensitive resin, and said insulating layer stepped-part and insulating layer protrusion are formed by changing the amount of light irradiation on the photosensitive resin.

(13) The suspension board of the above-mentioned (1), wherein the tip face of the pattern end is aligned with the tip face of the insulating layer directly therebeneath, or protruding from the tip face of the insulating layer in the tip direction.

(14) The suspension board of the above-mentioned (1), wherein the metal board on the tip side of the pattern end has an opening penetrating the board, an inner wall surface of the opening is aligned with the end face of the insulating layer, or retracted to a position beneath the insulating layer.

BRIEF DESCRIPTION OF THE DRAWINGS

FIG. 1(a) is a top view of a board surface of the suspension board with a circuit, and FIG. 1(b) is an end view of a partially enlarged section A-A of FIG. 1(a).

FIG. 8(b) is an embodiment of the present invention.

FIG. 10(a) shows a solder ball placed therein and FIG. 10(b) shows terminals connected with each other by melting the solder ball.

In the Figures, each symbol shows the following. 1; metal board, 2; insulating layer, 3; conductive layer, 4; pattern end, 4d; protrusion, 5; area for mounting a magnetic head, 6; through-hole, 7; solder ball

DETAILED DESCRIPTION OF THE INVENTION

In the present invention, as shown in the above-mentioned (1), a stepped-part forming a lowered tip side is formed on a top face of a pattern end, and the surface of the lowered side formed by the stepped-part is used as a surface on which a solder ball is arranged. Further, on the face of the lowered side, one or more protrusions made of a swollen conductive layer are formed in order to limit displacement of the solder ball at least in the tip direction and both side directions perpendicular to the tip direction.

By this constitution, when a straight line is drawn in a downward direction (direction to which gravity acts) from the gravity point of the solder ball, the straight line will pass through the region surrounded by the contact points between the protrusions and the solder ball, even when the pattern end tilts by about 45°.

The best mode of the present invention is explained in the following by referring to the Examples of the present invention.

FIG. 1(a) and FIG. 1(b) show schematic views of an enlarged tip of the suspension board with a circuit of the present invention. The basic structure, action and the like of the suspension board with a circuit as a whole are approximately the same as those explained for the background of the invention.

Figure 1:
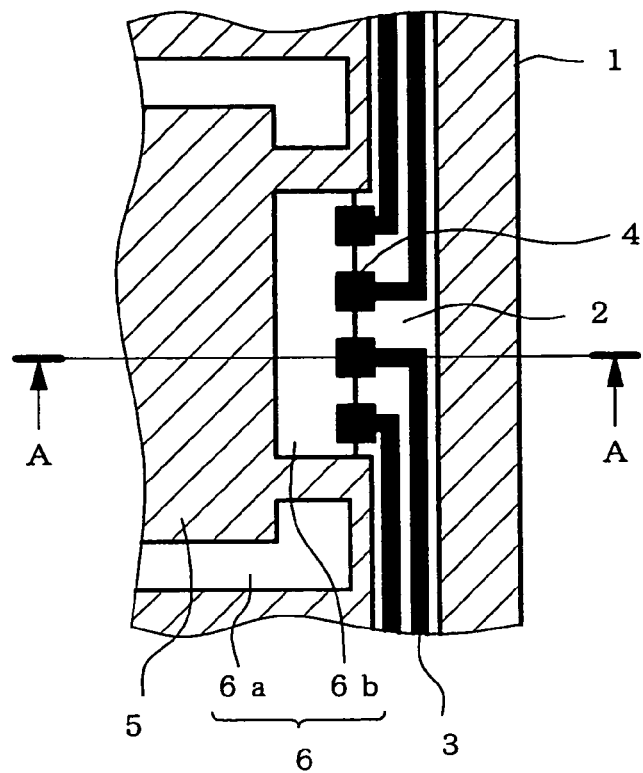
FIG. 1 is a schematic view of an enlarged tip of the suspension board with a circuit of the present invention, wherein a hatching is appropriately applied to distinguish the area.
Figure 1:
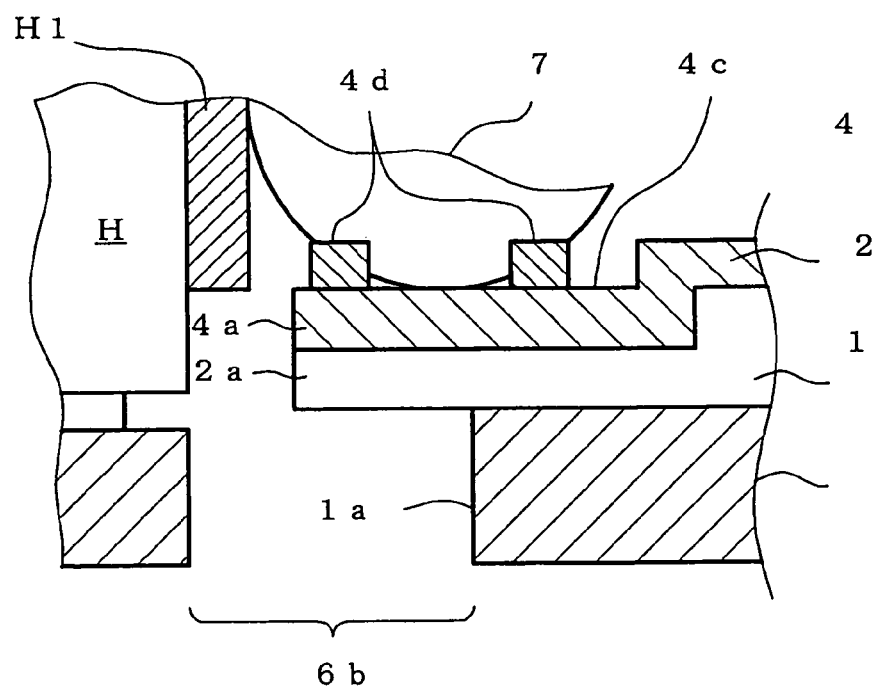

For example, the prior art may be referred to for the following aspects: (a) an elastic metal is used as a material of a board 1, and as a whole, it is a kind of a flat spring band, (b) an area 5 for mounting a magnetic head H1 is provided on the metal board 1, and a through-hole 6 is formed to surround the area 5 except a part thereof, whereby the area 5 is supported like a cantilever, (c) a conductive layer (printed circuit pattern) 3 is provided on the outside of the through-hole via an insulating layer 2, whereby the base side and the tip side of the whole suspension board with a circuit are communicated, (d) a pattern end 4 to be a connection terminal to connect the circuit pattern 3 to the terminal of a magnetic head is formed on an end of the circuit pattern 3, (e) a terminal of the disposed magnetic head and a pattern end 4 are arranged to form a 90° corner to allow connection by a solder ball and the like. In FIG. 1, a protective film further covering the conductive layer and the like are not shown. In the embodiment shown in FIG. 1(a), the tip direction of the pattern end is reverse to the tip direction of the whole suspension board with a circuit.

As shown in FIG. 1(a), the suspension board with a circuit has an area 5 to mount a magnetic head on a metal board 1 and, in the area outside the region, a conductive layer is formed as a circuit pattern 3 via an insulating layer 2 on the metal board. The end portion of the circuit pattern 3 is a pattern end 4 to be a connection terminal (terminal pad) for connection with a terminal of the magnetic head.

As shown in FIG. 1(b), a stepped-part providing a lower tip side is formed on the top face of the pattern end 4. The lower face (lower level surface) 4c formed by the stepped-part is used as a plane to set a solder ball 7. On the lower face is/are formed one or more protrusions 4d made of a swollen conductive layer 4 in order to limit displacement of the solder ball 7 in the tip direction and both transverse directions.

By this arrangement pattern of protrusions 4d, the displacement of the solder ball 7 can be suppressed as explained as the effect of the invention.

The material (member) of the metal board may be any as long as it is a metal plate processed to have elasticity permitting function as a suspension board, and known ones can be used. For example, flat spring materials such as a stainless steel plate, a copper-beryllium plate, a phosphor bronze plate and the like can be mentioned. Particularly, a stainless steel plate is a preferable material from the aspects of rigidity, corrosion resistance and the like.

The thickness of a metal board can be appropriately determined according to the elasticity of a material or member and the resilience required of the whole board. For example, in the case of a stainless steel plate, a suitable thickness is preferably about 10-70 µm.

While the material of the insulating layer is not particularly limited, synthetic resins such as polyimide resin, polyamide-imide resin, acrylic resin, polyethernitrile resin, polyethersulfone resin, poly(ethylene terephthalate) resin, poly(ethylene naphthalate) resin, polyvinyl chloride resin and the like can be mentioned. Particularly, a photosensitive resin is preferable for forming a stepped-part and protrusion on the top face of the insulating layer, utilizing a technique of gradation exposure as mentioned below, and photosensitive polyimide is a preferable material because it is superior in the heat resistance and chemical resistance.

Conventionally-known techniques can be applied as regards specific examples of photosensitive polyimide, production methods thereof, pattern formation techniques utilizing photosensitivity thereof and the like, and the above-mentioned Patent Reference 1 and JP-A-7-179604 (Patent Reference 5) provide detailed description thereof.

The thickness of the insulating layer is, in consideration of formation of the below-mentioned stepped-part, preferably about 5 µm-30 µm, particularly about 7 µm-15 µm.

The material of the conductive layer may be any circuit pattern material used for conventionally known suspension boards with circuit and, for example, copper, nickel, gold, solder, alloys thereof and the like can be mentioned. Particularly, copper is a preferable material from the aspects of conductivity, cost and processability. The thickness of the conductive layer is preferably about 3 µm-20 µm, particularly about 5 µm-15 µm.

The conductive layer may have various multi-layer structures as necessary in addition to a single layer. For example, a material layer preferable for soldering may be formed as a surface layer on a pattern end etc., and the like.

Figure 2:
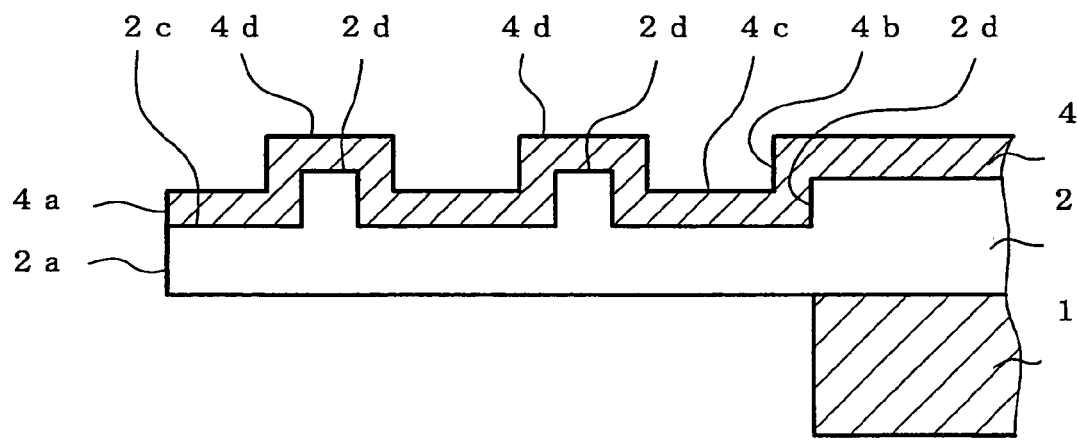
FIG. 2 is a view showing one embodiment of a stepped-part formed on a top face of a pattern end and a structure of a protrusion in the present invention.
Figure 2:
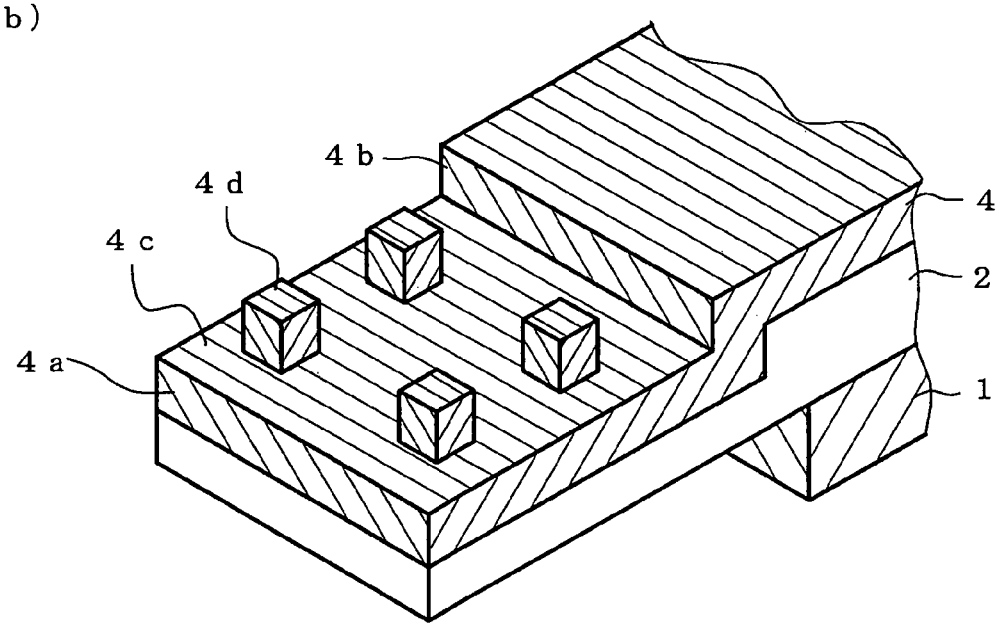

While the method for forming a stepped-part and a protrusion on the top face of the pattern end is not particularly limited, preferable methods include a method comprising forming, on the top face of an insulating layer, cores of a stepped-part and a protrusion on the pattern end. That is, as shown in FIG. 2(a), an insulating layer stepped-part 2b (for convenience, symbol 2b is attached to the perpendicular plane of the stepped-part in the Figure) providing a lower tip side is formed on the top face of an insulating layer 2 directly beneath the pattern end, an insulating layer protrusion 2d to be a core of a protrusion 4d is formed on a lower face 2c provided by the stepped-part, and a pattern end 4 is formed to cover the insulating layer stepped-part 2b and insulating layer protrusion 2d. As a result, a stepped-part 4b and a protrusion 4d are provided on the top face of the pattern end 4, due to the insulating layer stepped-part 2b and insulating layer protrusion 2d.

As a method for forming an insulating layer stepped-part 2b and an insulating layer protrusion 2d, a method comprising gradation exposure of a photosensitive resin as a material of the insulating layer 2 can be mentioned.

The gradation exposure is a technique using a gradation exposure mask to gradually or stepwisely control the irradiation amount of light, whereby stepwise difference is produced in the thickness of insulating layer after curing.

A gradation exposure mask is a mask made of a material that does not permit permeation of light, which has an optional area of a mask layer having a dot-like or stripe-like pattern formed by ultrafine light permeation holes in assembly (in other words, a mask layer is formed to have a mesh pattern, a stripe pattern and the like). By selecting the arrangement pattern of light permitting holes, such as the size of the light permitting holes and density of assembly and the like, the mask can freely change the amount of light irradiated on the photosensitive resin.

To form such a gradation exposure mask, for example, a method comprising vapor deposition of a chrome thin film on a quartz glass board to form a stripe (mesh) pattern of light permeation parts and light shields and the like can be mentioned. The light transmission of the part free of a chrome thin film (light transmission part) is about 100%, and the light transmission of the part having a chrome thin film (light shield part) is about 0%. By controlling the area ratio of the both, size of light permeation hole, density and the like, a masked area having a stripe (net-like) pattern can have any light transmission of the whole area, and as a result, gradation exposure is enabled.

One embodiment of process for forming an insulating layer stepped-part and an insulating layer protrusion is as follows. The material of an insulating layer is photosensitive polyimide in one embodiment.

A photosensitive polyamide acid (photosensitive polyimide precursor) liquid is applied on a metal board and dried to give a photosensitive polyamide acid film (layer).

Gradation exposure is performed with a photosensitive polyamide acid film to meet the relationship between the amounts of light to be irradiated of (part to be completely removed; no irradiation)<(part where layer thickness should be reduced)<(layer to be retained as it originally is) using a gradation exposure mask.

After gradation exposure as mentioned above, the film is heated at a temperature of 120-180° C. for about 2-10 minutes, and then developed. As a result, a part that was not exposed to the light at all (non-exposed part) is completely removed by a developer solution to form, for example, tip face $2a$ and the like, a part exposed to a weak light through a stripe pattern mask remains thin to form lower face $2c$, and a part exposed to a strong light without the mask remains as a layer having the original thickness, whereby a stepped-part and a protrusion of a desired pattern are formed.

When this is heated (cured by heating), a polyimide insulating layer having a stepped-part $2b$ and protrusion $2d$ having a desired pattern can be obtained as shown in FIG. $2(a)$ and $2(b)$.

As to the wavelength, light source, developing solution and the like used for exposure of the photosensitive resin, conventionally known techniques can be referred to.

Next, a preferable embodiment of a protrusion formed on a top face of the pattern end is explained.

FIG. 3-FIG. 6 are top views of a pattern end. In the pattern end shown in the drawings, the upside of the drawings is a stepped-part direction, the downside is a tip direction and the right and left directions of the drawings are both side directions. To the surface at the high stepped-part side and the top face of the protrusion, hatching is applied in order to distinguish them from the lower face. Although in the drawings, for explanation, the forms wherein an outline of each part is described by straight lines and the straight lines are perpendicular-parallel to each other are employed as examples, complex forms using the technique of gradation exposure may also be employed. Further, in actual minute structures, the details assume natural roundness in some cases.

In embodiments shown in FIGS. $3(a)$-$(c)$ and FIG. $4(a)$, three protrusions are formed so that the protrusions can contact a solder ball to be placed at 3 points. By these three protrusions, the solder ball is limited so that it will not move in the tip direction, both side directions and stepped-part direction.

In the embodiments of FIGS. $3(a)$-$(c)$, the arrangement pattern is that two protrusions $4d1$ and $4d2$ out of the three protrusions are on the stepped-part side, which contact the solder ball at the stepped-part side, and the remaining one protrusion $4d3$ contacts the solder ball on the tip side. Focusing on the contact points with the solder ball, the contacts are made at the same 3 points for all the embodiments of FIGS. $3(a)$-$(c)$.

In the embodiments of FIGS. $3(a)$ and $(b)$, the two protrusions $4d1$ and $4d2$ on the stepped-part side are connected to a stepped-part surface $4b$ and the protrusions $4d1$ and $4d2$ are connected to each other in an arch-like form. In FIG. $3(a)$, protrusion $4d3$ on the tip side is a point-like, isolated island-like protrusion. In FIG. $3(b)$, protrusion $4d3$ on the tip side is a ridge-shaped protrusion which is elongated in the both side directions.

In the embodiment of FIG. $3(c)$, protrusions $4d1$ and $4d2$ on the stepped-part side are apart from the stepped-part and all three protrusions are point-like, isolated island-like protrusions.

These forms of the protrusion are mere examples, and the parts unrelated to the contact with a solder ball may be connected to each other in any form.

Figure 3:
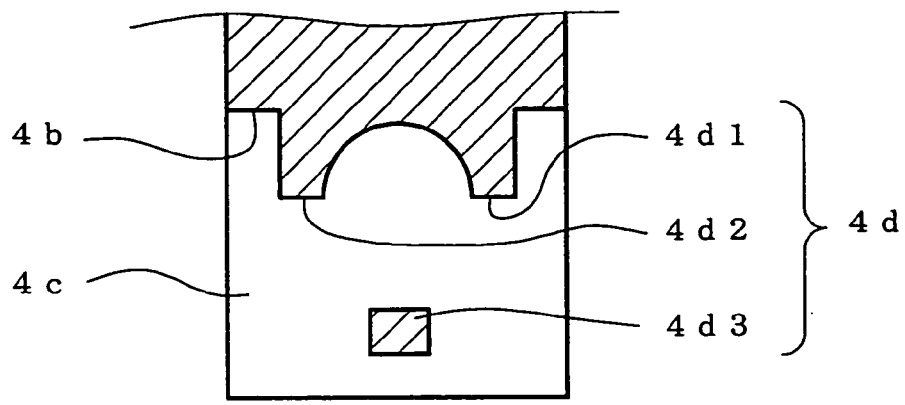
FIG. 3 is a top view of a pattern end of the suspension board with a circuit of the present invention, showing one embodiment of a configuration pattern of a protrusion.
Figure 3:
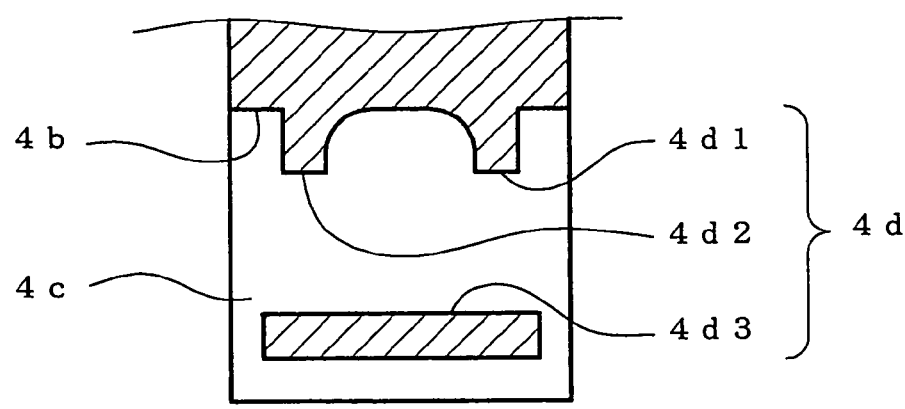
Figure 3:
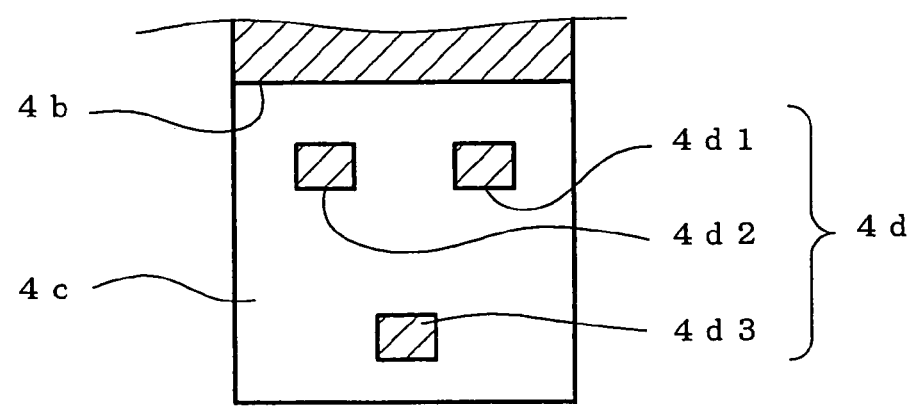
Figure 4:
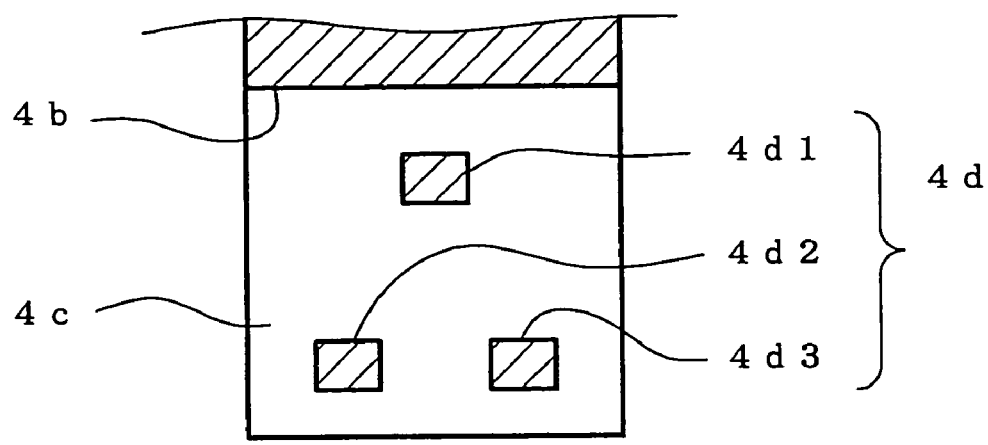
FIG. 4 is a top view of a pattern end of the suspension board with a circuit of the present invention, showing one embodiment of a configuration pattern of a protrusion.
Figure 4:
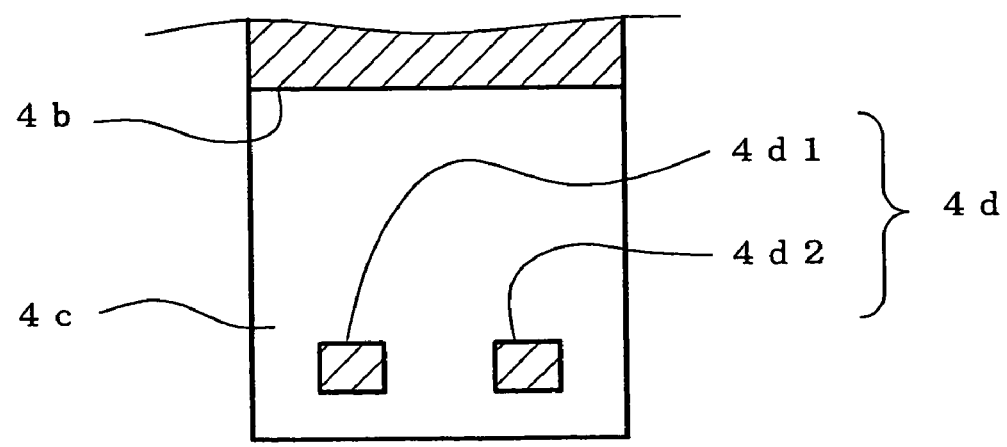

The embodiment of FIG. $4(a)$ is different from the embodiment of FIG. 3 in terms of a configuration pattern of the contact points.

In the embodiment of FIG. $4(a)$, the number of the protrusion on the stepped-part side is 1 ($4d1$), and 2 protrusions $4d2$ and $4d3$ are arranged on the tip side.

In the embodiment of FIG. $4(b)$, no protrusion on the stepped-part side exist and stepped-part surface $4b$ contacts the solder ball and contributes to the limitation, thus forming a 3 point contact by stepped-part surface $4b$ and 2 protrusions $4d1$ and $4d2$.

It may be appropriately determined whether the stepped-part surface is used for the limitation of the solder ball or not according to the relation between the length from the tip of the pattern end to the stepped-part surface and the size (diameter) of the solder ball. For example, when the diameter of the solder ball is smaller than the length from the tip of the pattern end to the stepped-part surface, it is preferable to separately provide a protrusion on the stepped-part side, rather than to use the stepped-part surface for limiting the solder ball.

Figure 5:
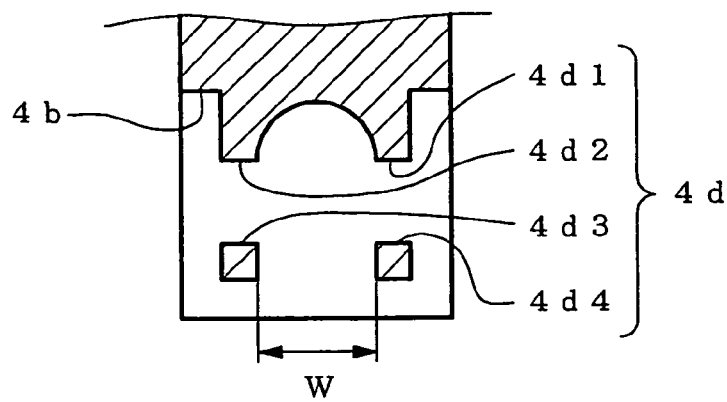
FIG. 5 is a top view of a pattern end of the suspension board with a circuit of the present invention, showing one embodiment of a configuration pattern of a protrusion.
Figure 5:
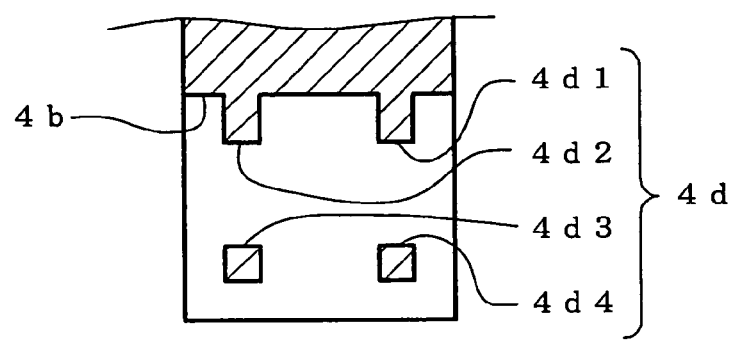
Figure 5:
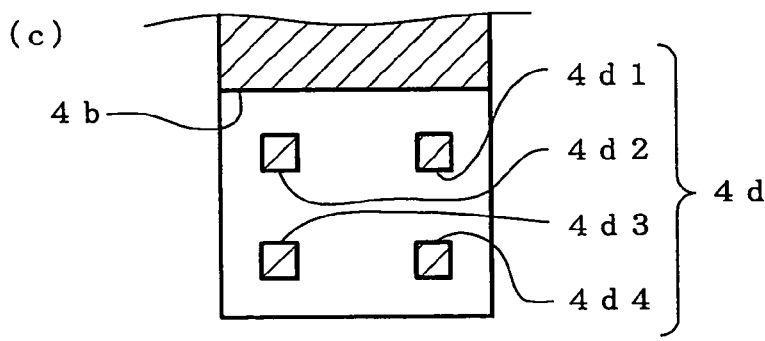
Figure 5:
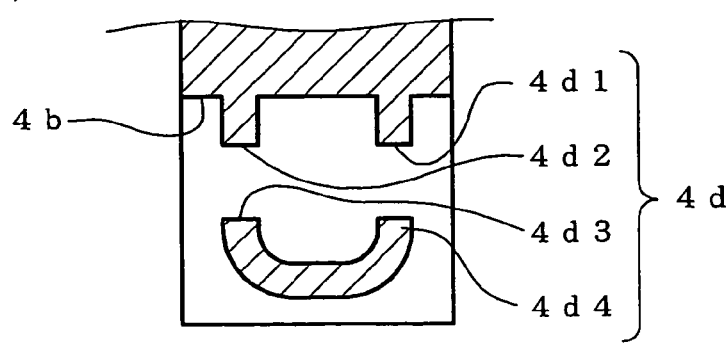
Figure 6:
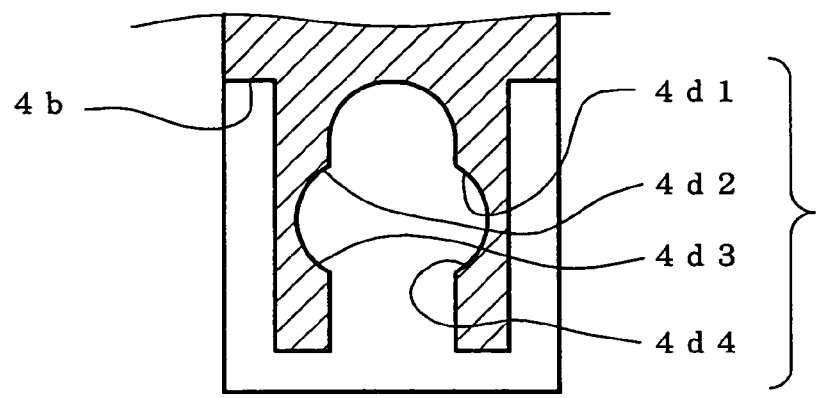
FIG. 6 is a top view of a pattern end of the suspension board with a circuit of the present invention, showing one embodiment of a configuration pattern of a protrusion.
Figure 6:
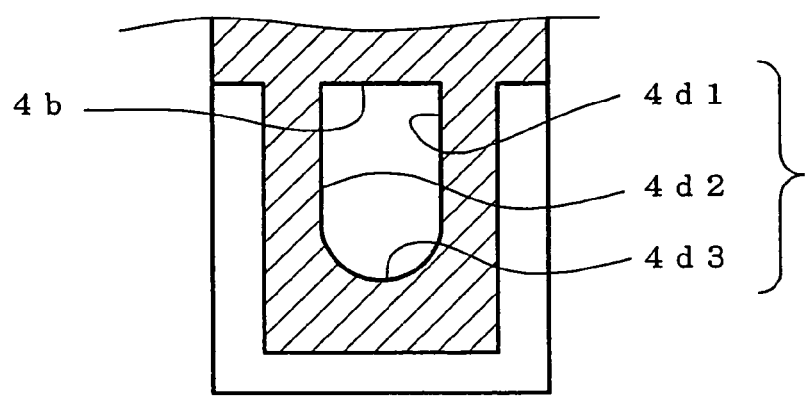
Figure 6:
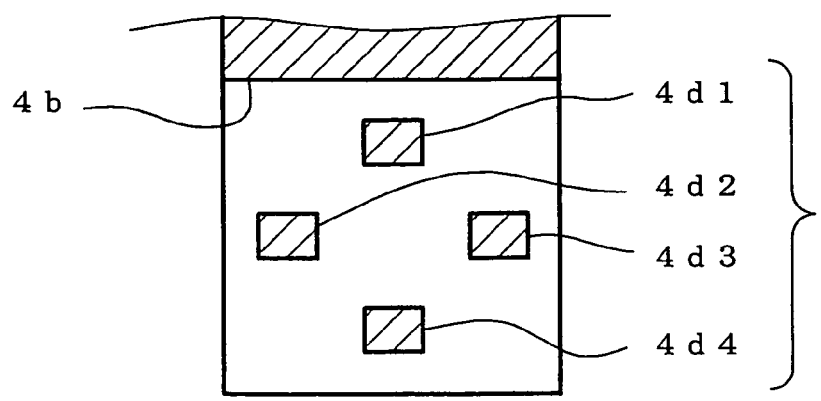

In the embodiments of FIG. 5-FIG. 6, protrusions are formed so that the protrusion can contact a solder ball to be placed at 4 points. By these protrusions, the solder ball is controlled so that it will not move in the tip direction, both side directions and stepped-part direction.

In the embodiments of FIGS. $5(a)$ and $(b)$, two protrusions $4d1$ and $4d2$ on the stepped-part side are connected to stepped-part surface $4b$, and protrusions $4d3$ and $4d4$ on the tip side are point-like, isolated island-like protrusions.

In the embodiment of FIG. $5(c)$, all of the four protrusions $4d1$-$4d4$ are point-like, isolated island-like protrusions. In the embodiment of FIG. $5(d)$, all of the four protrusions $4d1$-$4d4$ are point-like, isolated island-like protrusions. Two protrusions $4d1$ and $4d2$ on the stepped-part side are connected to stepped-part surface $4b$, and protrusions $4d3$ and $4d4$ on the tip side are connected to each other to form a ridge-shaped protrusion.

In the embodiment of FIG. $6(a)$, a concave portion is provided in an inside of the central part of the two ridge-shaped protrusions arranged from the stepped-part toward the tip direction, and relatively, protrusions $4d1$ - $4d4$ are formed.

In the embodiment of FIG. $6(b)$, two ridge-shaped protrusions arranged from the stepped-part toward the tip direction are connected to each other at the tip part. By this configuration, the protrusions contact a solder ball at 4 points, namely stepped-part surface $4b$, inner surfaces of the two ridge-shaped protrusions $4d1$ and $4d2$ and inner surface of the tip part $4d3$.

The embodiment of FIG. $6(c)$ is different from the embodiments of FIGS. $5(a)$-$(d)$ and FIG. $6(a)$ in terms of a configuration pattern of contact points. In the embodiment of FIG. $6(c)$, one contact point exists at each of the stepped-part side and the tip side, and two contact points for controlling the both side directions exist at the middle part thereof. In the embodiment of FIG. 6(c), all the four protrusions (4d1-4d4) are point-like, isolated island-like protrusions.

The embodiments shown above are the embodiments wherein protrusions are formed at positions wherein contacts with a solder ball are made at 3 or 4 points in order to limit displacement of a solder ball in the tip direction, both side directions and stepped-part direction. In the embodiments of FIG. 4(b) and FIG. 6(b), however, a stepped-part surface per se is used instead of a protrusion on the stepped-part side.

The design of protrusions may be freely changed by taking contact points into consideration, to ridge-shaped protrusions by connecting protrusions to each other, or to island-like protrusions which are independent of one another.

In the embodiments of FIGS. 3(a)-(c), FIG. 4(a), FIGS. 5(a)-(d), and FIGS. 6(a) and (c), protrusions are provided at the stepped-part side from a solder ball, and while limiting the displacement of a solder ball in the stepped-part direction by the protrusions, the displacement in the both side directions is also limited by the two protrusions on the stepped-part side.

Further, in the embodiments of FIGS. 4(a), (b), and FIGS. 5(a)-(d), protrusions (tip side protrusions) are provided at the tip side from a solder ball. While limiting the displacement of a solder ball in the tip direction by the tip side protrusions, the displacement in the both side directions is also limited by the two tip side protrusions.

On the other hand, in the embodiments of FIGS. 6(b) and (c), protrusions 4d2 and 4d3 positioned at the both side directions respect to the central position of a solder ball are included. These protrusions are solely used for limiting displacement of a solder ball in the side directions.

Figure 7:
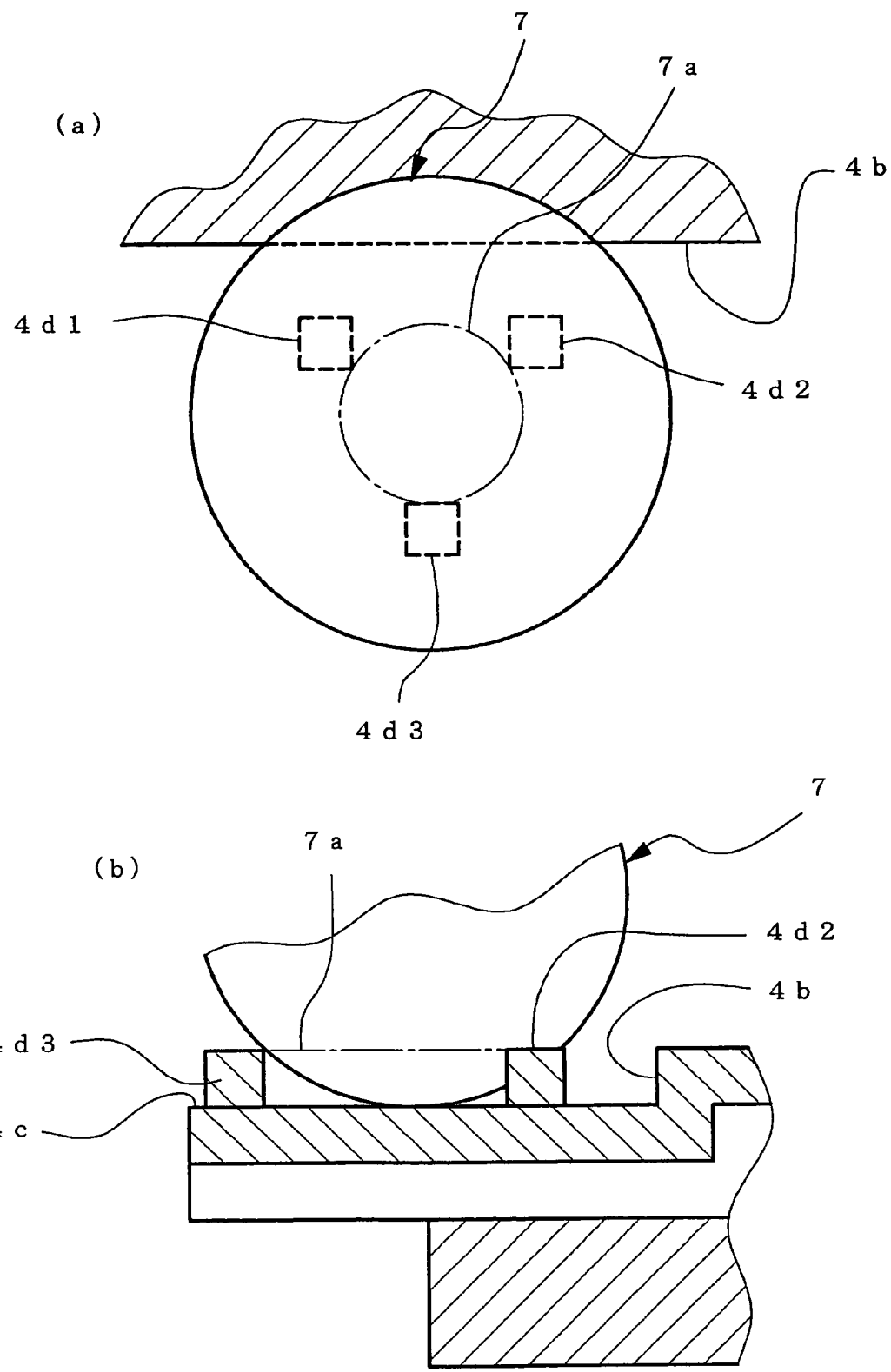
FIG. 7 is a view showing how the three protrusions shown in FIG. 3(c) are in contact with a solder ball.

FIG. 7 is a view showing how the three protrusions shown in FIG. 3(c) contact a solder ball. The arrange pattern of protrusions in the drawing may be replaced by other patterns such as four protrusions shown in FIG. 5(c) and the like for understanding. FIG. 7(a) is a view wherein solder ball 7 is placed on the protrusions, and FIG. 7(b) is a side view of the same. A dashed line 7a in FIGS. 7(a) and (b) shows the outer shape of the sphere of a solder ball that intrudes below the top face of the protrusion.

In the embodiment of FIG. 7, an ideal contact condition between protrusions and a solder ball is described. The solder ball simultaneously contacts three protrusions 4d1-4d3, as well as a lower face. Actually, it is difficult to achieve an ideal contact as shown in the Figure due to an error in the diameter of a solder ball, a size error of each part of the protrusion, errors in arranged positions, and the like.

Depending on the methods of taking the designed sizes such as a diameter of a solder ball, height, position and size of protrusions, it is possible to achieve (i) a relation wherein a solder ball contacts lower face 4c and cause a jolt (play) between the solder ball and the protrusion, or (ii) a relation wherein a solder ball does not contact lower face 4c, three protrusions hold the solder ball, and no jolt occurs between the ball and the protrusions.

Comparing the aforementioned (i) and (ii), the relation of (ii) is preferable since three protrusions hold the solder ball without a jolt to fix the solder ball more firmly and suppress deviation.

As the solder ball, a known one may be used, and generally, it is in an approximately spherical form and the diameter thereof is about 80 μm-100 μm.

When three protrusions come into contact with a solder ball at 3 points, the protrusions are preferably arranged in such a manner that the three contact points form a regular triangle, which affords a stable support. Each contact may be a point contact, line contact or surface contact.

Depending on the diameter of the solder ball, the length of one side of the regular triangle formed by the contact points (distance between contact points) relative to the solder ball having the above-mentioned general diameter is preferably 40 μm-70 μm, particularly 50 μm-60 μm.

When 4 or more protrusions come into contact with a solder ball at 4 or more points, the contact points are preferably present on a circle having the same diameter as a circumscribed circle of the aforementioned regular triangle shape and surround the solder ball. For example, when protrusions are provided in such a manner that the four contact points form a square, the length of one side of the square is preferably 40 μm-70 μm, particularly 50 μm-60 μm.

In the embodiments of FIGS. 5(a)-(d) and FIG. 6(a), the quadrate formed by 4 contact points consists of two sides parallel to the stepped-part face and two sides perpendicular thereto. An embodiment of such protrusions is also an embodiment wherein the middle parts m are further removed from [simple two parallel ridge-shaped protrusions extending in the tip direction (embodiment of FIG. 8(a))].

Figure 8:
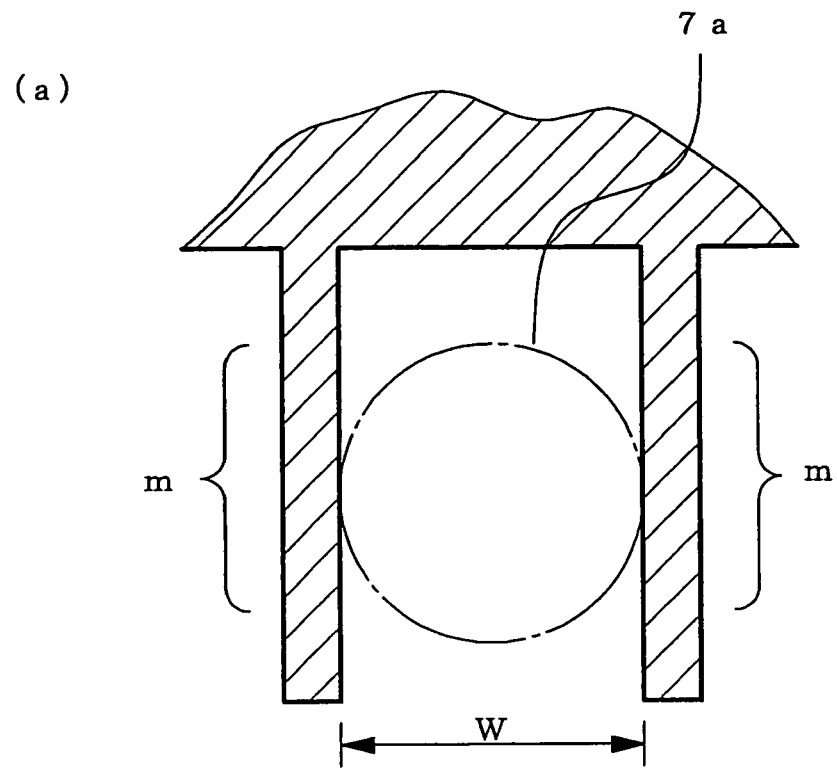
FIG. 8 is a view showing how the settlement of a solder ball changes between simple two ridge-shaped protrusions (FIG. 8(a)) and when the middle part m thereof is removed (FIG. 8(b)).
Figure 8:
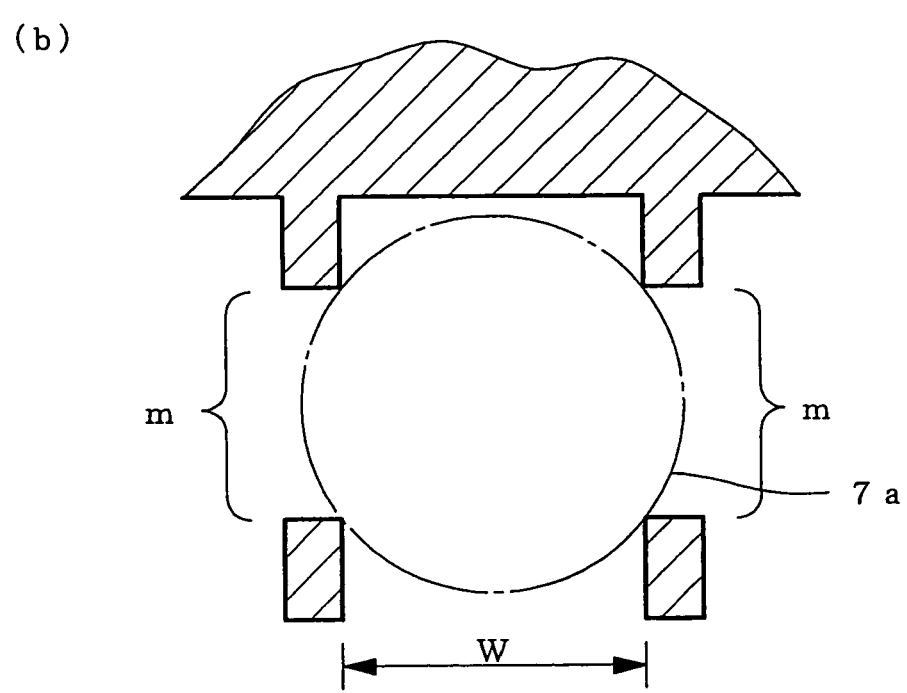
Figure 9:
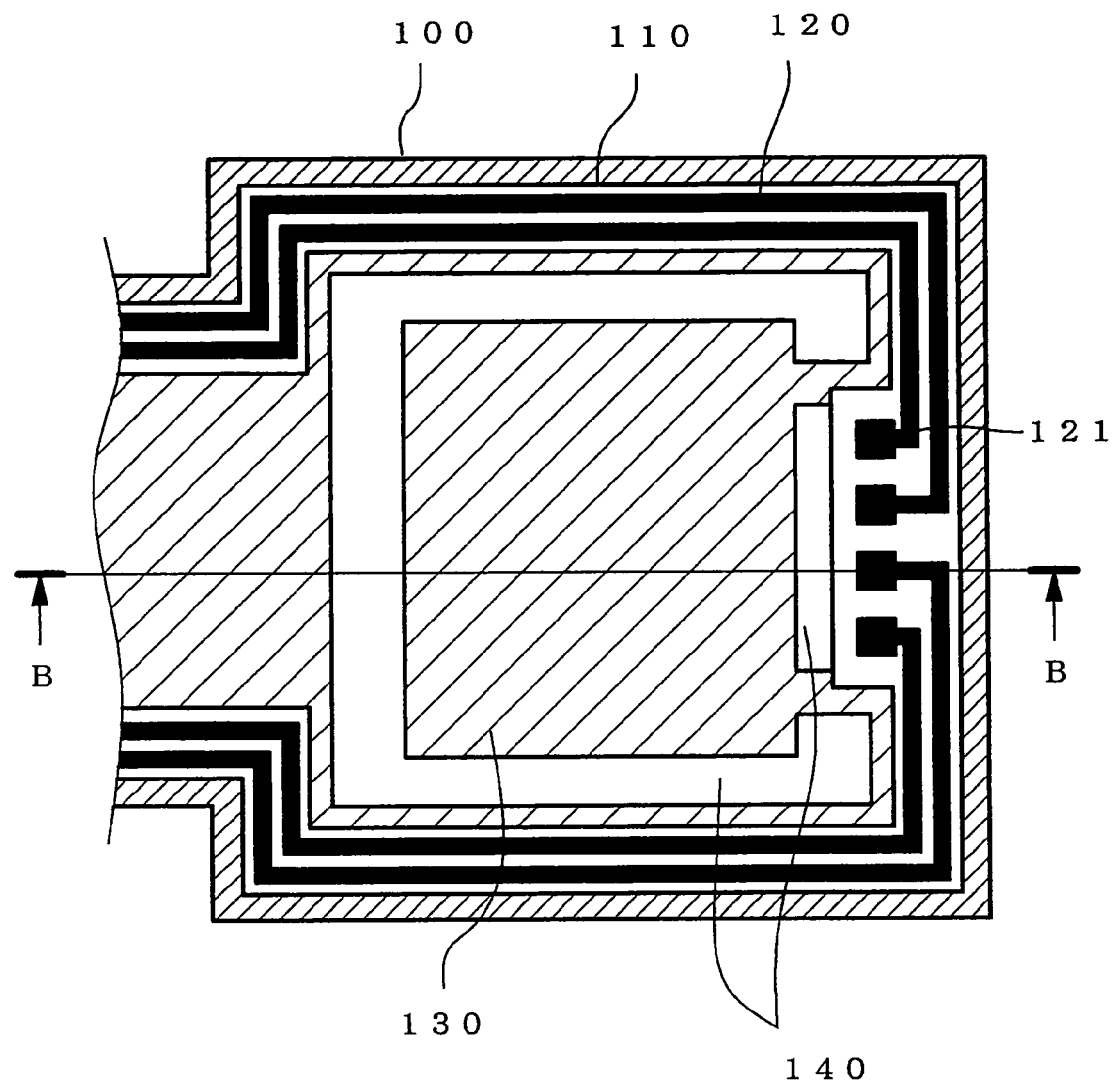
FIG. 9 is a schematic view of a conventional suspension 25 board with a circuit wherein only the tip is enlarged, and hatching is applied to the metal board to clearly show a through-hole (space) formed on the metal board.
Figure 10:
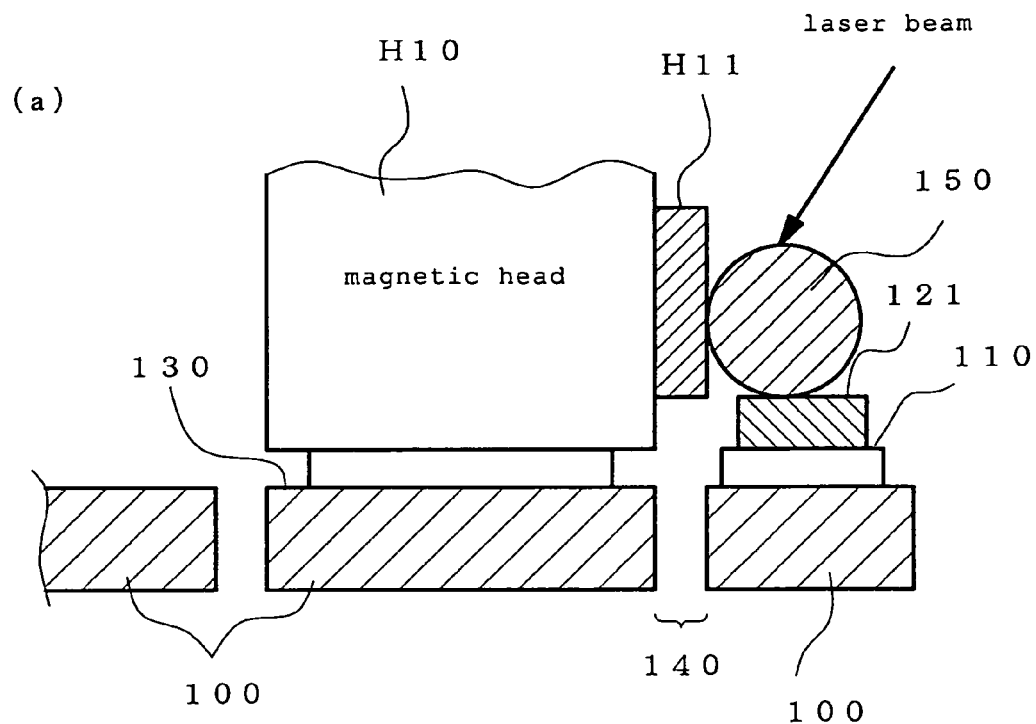
FIG. 10 is an end view showing a section B-B of the suspension board with a circuit of FIG. 9 with a magnetic head.
Figure 10:
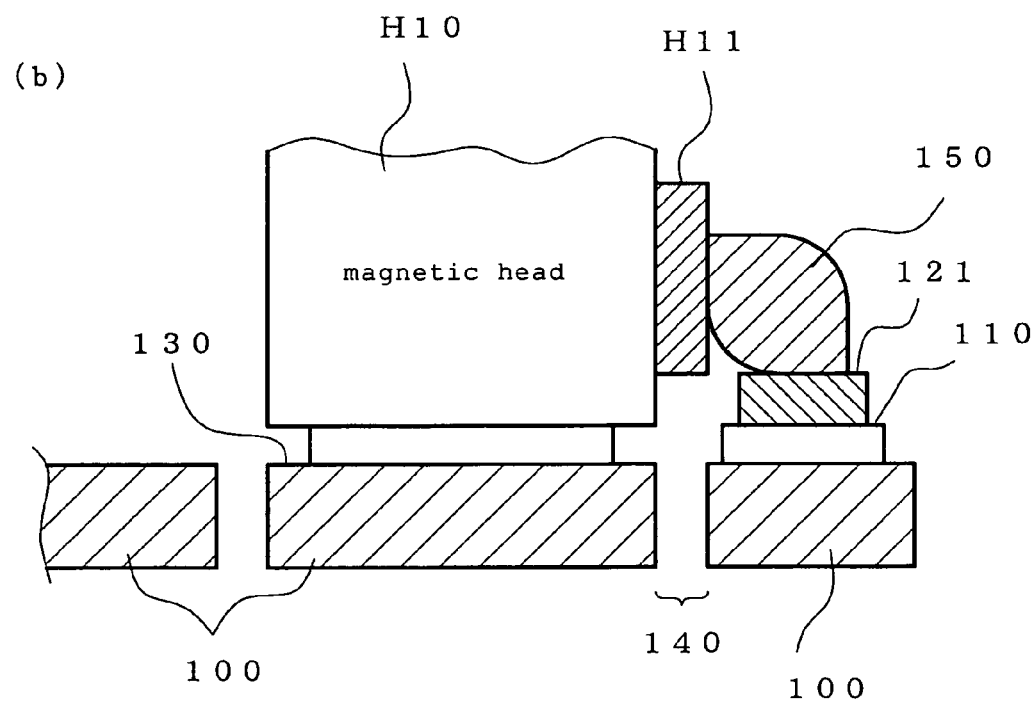

The embodiment shown in FIG. 8(a) does not have the constitution of the present invention, and a solder ball is displaced in the tip direction. In contrast, a middle part m is completely removed in the embodiment of FIG. 8(b), and the middle part m is partially removed in the embodiment of FIG. 6(a). Thus, the solder ball is stuck in the notch and cannot move in the tip direction.

The circle in a broken line in FIG. 8(b) shows the outer shape of the partial sphere of a solder ball that intrudes below the top face of the protrusion, as in FIG. 7. As is clear from these Figures, in the embodiment wherein the middle parts m are further removed from [simple two parallel ridge-shaped protrusions] extending in the tip direction, the distance W between two protrusions present on lines parallel to a stepped-part face is the same as the distance W between the [simple two parallel ridge-shaped protrusions], but the solder ball can be retracted more deeply and the displacement of the solder ball can be further suppressed.

Accordingly, the embodiments of FIG. 6(a), FIG. 8(b) more preferably suppress an increase in the displacement of the solder ball due to microscaling of a pattern end.

When the protrusion is an isolated island, the shape of the protrusion may be a column as shown in FIG. 2(b), triangle pole, polygonal pole, cylinder and the like.

The height of the protrusions is about 3 μm-20 μm, and 5 μm-10 μm is particularly preferable for formation on a conductive layer of the suspension board with a circuit.

When the protrusion is cylindrical, its outer diameter is about 15 μm-25 μm, and 17 μm-23 μm is particularly preferable for the pattern end at this stage.

When the protrusion has a shape other than a cylinder, the size and orientation can be appropriately determined by referring to the outer diameter of the cylinder so that a solder ball will suitably fit therein.

A method for forming a conductive layer as any circuit pattern on a metal board via an insulating layer, and a method for forming a through-hole on a metal board may be a conventionally-known technique. The above-mentioned Patent Reference 4 (JP-A-2006-120288) also explains the detail of the process.

In the embodiment of FIG. 1(b), a pattern end 4 protrudes as a cantilever on a through-hole 6b, and an insulating layer 2 directly beneath it also protrudes along the lower face thereof, and the end face 4a of a pattern end 4 and an end face 2a of an insulating layer 2 are aligned with each other.

In this embodiment, since an insulating layer extends along the lower side of the conductive layer, the terminal part protruding like a cantilever has high rigidity, which is a preferable embodiment.

In the embodiment of FIG. 1(b), an end surface 4a of the pattern end is aligned with the end surface 2a of the insulating layer 2. However, the end surface 4a may protrude in the tip direction from the end surface 2a of the insulating layer 2. By these constitutions, irradiation on the terminal portion of the insulating layer 2 is suppressed, even if the laser beam is deviated from the solder ball and irradiated on the surrounding surfaces.

A through-hole 6 is formed around an area 5 for mounting a magnetic head H1. As shown in FIGS. 1(a) and (b), opening 6b for penetrating a metal board 1 is also formed on the tip side (the extremity side) of the pattern end. Formation of the through-hole 6b aims at increasing the heat radiation efficiency during magnetic head H1 bonding.

The end face 1a of a through-hole 6b formed on a metal board 1 may protrude from the end face of the pattern end, but an embodiment wherein the inner wall surface 1a of the opening is retracted from the end face 2a of the insulating layer 2 to a position beneath the insulating layer 2 is preferable, from the aspect of suppression of a short-circuit between the conductive layer and the metal board, as shown in FIG. 1(b).

The amount of retraction of the inner wall surface 1a of the opening from the end face 2a of the insulating layer 2 is preferably about 0 μm-200 μm, particularly preferably 10 μm-100 μm.

As mentioned above, the suspension board with a circuit of the present invention omnidirectionally suppresses displacement of a solder ball by protrusions. Even when the pattern end is narrow, the presence of a notch space between protrusions permits a solder ball to be tightly fit in between the protrusions.

By such action, the suspension board with a circuit of the present invention can stably maintain a supplied solder ball at a given position and limits easy displacement thereof.

This application is based on a patent application No. 2007-003621 filed in Japan and U.S. provisional 60/904808, the contents of which are incorporated in full herein by this reference.

The invention claimed is:

1. A suspension board with a circuit, which comprises a metal board comprising an area for mounting a magnetic head, and other area comprising a conductive layer provided on the metal board as a circuit pattern via an insulating layer, said circuit pattern having a pattern end to be a terminal for connection with a terminal of the magnetic head, the pattern end having, on its top face, a stepped-part with a lower tip side, wherein a lower face of the stepped-part is used as a plane to set a solder ball, and
the lower face having one or more protrusions made of a swollen conductive layer to limit displacement of the solder ball at least in a tip direction, which is a direction from the stepped-part side toward the tip side, as well as displacement of the solder ball in both side directions, which are orthogonal directions relative to the tip direction.

2. The suspension board of claim 1, wherein the displacement of the solder ball in a stepped-part direction, which is a direction from the tip side toward the stepped-part side, is limited by the stepped-part.

3. The suspension board of claim 1, wherein the protrusions comprise a protrusion on a stepped-part side, which protrusion is located closer to the stepped-part than the solder ball to be set, the protrusion on the stepped-part side is so formed as to limit displacement of the solder ball in a stepped-part direction, which is a direction from the tip side toward the stepped-part side.

4. The suspension board of claim 3, wherein said protrusion on the stepped-part side is so formed as to be able to contact the solder ball at two or more points so that it can limit displacement of the solder ball in the stepped-part direction, and simultaneously, displacement in the both side directions.

5. The suspension board of claim 3, wherein said protrusion is so formed as to be able to contact the periphery of the solder ball at three or four points so that it can limit displacement of the solder ball in the tip direction, the both side directions and the stepped-part direction.

6. The suspension board of claim 1, wherein said protrusions comprise side protrusions located in both transverse directions relative to the center of the solder ball to be set, and the side protrusions can limit displacement of the solder ball in the both side directions.

7. The suspension board of claim 1, wherein said protrusions comprise a tip side protrusion located closer to the tip than the solder ball to be set, and the tip side protrusion is so formed as to limit displacement of the solder ball in the tip direction.

8. The suspension board of claim 7, wherein the tip side protrusion is so formed as to be able to contact the solder ball at two or more points so that it can limit displacement of the solder ball in the tip direction, and simultaneously, displacement in the both side directions.

9. The suspension board of claim 1, wherein the protrusions on the top face of the pattern end are island-like protrusions independent of each other or ridge-shaped protrusions, or include both of these protrusions.

10. The suspension board of claim 1, wherein the protrusion on the top face of the pattern end comprises two ridge-shaped protrusions extending from the stepped-part side to the tip side, and the two protrusions each have a notch part at the center thereof, which establishes contact with the solder ball at 4 points.

11. The suspension board of claim 1, wherein the insulating layer directly beneath the pattern end has an insulating layer stepped-part forming a lower tip side on the top face thereof, so that said stepped-part will be formed on the top face of the pattern end,
the lower face of the insulating layer stepped-part has an insulating layer protrusion to be a core of said protrusion on the lower face of the pattern end, and
the insulating layer stepped-part and the insulating layer protrusion are covered by the pattern end, whereby said stepped-part and said protrusion are formed on the top face of the pattern end.

12. The suspension board of claim 11, wherein the insulating layer is made from a photosensitive resin, and said insulating layer stepped-part and insulating layer protrusion are formed by changing the amount of light irradiation on the photosensitive resin.

13. The suspension board of claim 1, wherein the tip face of the pattern end is aligned with the tip face of the insulating layer directly therebeneath, or protruding from the tip face of the insulating layer in the tip direction.

14. The suspension board of claim 1, wherein the metal board on the tip side of the pattern end has an opening penetrating the board, an inner wall surface of the opening is aligned with the end face of the insulating layer, or retracted to a position beneath the insulating layer.

* * * * *